(12) United States Patent
Kim et al.

(10) Patent No.: US 11,374,310 B2
(45) Date of Patent: Jun. 28, 2022

(54) ELECTRONIC DEVICE COMPRISING ANTENNA DEVICE

(71) Applicant: SAMSUNG ELECTRONICS CO., LTD., Gyeonggi-do (KR)

(72) Inventors: Kyung-Bin Kim, Gyeonggi-do (KR); Yong-Eui Hong, Seoul (KR); Jin-U Kim, Seoul (KR)

(73) Assignee: Samsung Electronics Co., Ltd

( * ) Notice: Subject to any disclaimer, the term of this patent is extended or adjusted under 35 U.S.C. 154(b) by 271 days.

(21) Appl. No.: 16/772,600

(22) PCT Filed: Aug. 20, 2018

(86) PCT No.: PCT/KR2018/009525
§ 371 (c)(1),
(2) Date: Jun. 12, 2020

(87) PCT Pub. No.: WO2019/124670
PCT Pub. Date: Jun. 27, 2019

(65) Prior Publication Data
US 2020/0388911 A1 Dec. 10, 2020

(30) Foreign Application Priority Data

Dec. 19, 2017 (KR) ........................ 10-2017-0174877

(51) Int. Cl.
*H05K 3/40* (2006.01)
*H01Q 1/38* (2006.01)
(Continued)

(52) U.S. Cl.
CPC ................ *H01Q 1/38* (2013.01); *H01Q 1/12* (2013.01); *H05K 1/115* (2013.01); *H05K 1/181* (2013.01);
(Continued)

(58) Field of Classification Search
CPC ...... H05K 1/115; H05K 3/282; H05K 3/4038; H05K 7/1427; H05K 2201/10098; H05K 2201/09827; H05K 2201/0999; H05K 3/42
See application file for complete search history.

(56) References Cited

U.S. PATENT DOCUMENTS

2013/0303243 A1* 11/2013 Park ........................ H01Q 1/243
  455/575.7
2015/0288055 A1* 10/2015 Youm ...................... H01Q 9/42
  343/702
(Continued)

FOREIGN PATENT DOCUMENTS

KR 1020110037522 4/2011
KR 2020130001062 2/2013
(Continued)

OTHER PUBLICATIONS

PCT/ISA/210 Search Report issued on PCT/KR2018/009525, dated Jun. 27, 2019, pp. 5.
(Continued)

*Primary Examiner* — Sherman Ng
(74) *Attorney, Agent, or Firm* — The Farrell Law Firm, P.C.

(57) ABSTRACT

An electronic device according to various embodiments of the present invention may comprise a housing; an inner plate which is built into the housing, at least a portion of which is made of a synthetic resin material, and which comprises a first surface, a second surface facing the opposite direction to the first surface, a first through-hole formed in a cone-shaped cross-section the diameter of which gradually decreases the closer to the second surface from the first surface, and a second through-hole formed in a cone-shaped cross-section, which is disposed adjacent to the first through-hole and the diameter of which gradually decreases
(Continued)

the closer to the first surface from the second surface; a first conductive line which is formed on the first surface and is formed to overlap with the first through-hole at least partially when viewed from the first surface, a second conductive line which is formed on the second surface and is formed to overlap with the second through-hole at least partially when viewed from the second surface, a first conductive layer which is deposited conformally on an inner wall of the first through-hole and electrically connected to at least one of the first conductive line and the second conductive line, a second conductive layer which is deposited conformally on an inner wall of the second through-hole and electrically connected to at least one of the first conductive line and the first conductive line, and a wireless communication module which is electrically connected to at least one of the first conductive line and the second conductive line, wherein the first conductive line, the second conductive line, the first conductive layer, and the second conductive layer may comprise the same composition of materials. Such an electronic device may vary according to the embodiment.

13 Claims, 7 Drawing Sheets

(51) Int. Cl.
*H01Q 1/12* (2006.01)
*H05K 1/11* (2006.01)
*H05K 1/18* (2006.01)
*H05K 3/28* (2006.01)
*H05K 3/46* (2006.01)
*H05K 7/14* (2006.01)

(52) U.S. Cl.
CPC .......... *H05K 3/282* (2013.01); *H05K 3/4038* (2013.01); *H05K 3/4644* (2013.01); *H05K 7/1427* (2013.01); *H05K 2201/10098* (2013.01)

(56) References Cited

U.S. PATENT DOCUMENTS

| | | | |
|---|---|---|---|
| 2015/0289401 A1* | 10/2015 | Hikino | H01Q 1/242 174/520 |
| 2016/0233573 A1 | 8/2016 | Son et al. | |
| 2017/0084986 A1 | 3/2017 | Gang et al. | |
| 2017/0133748 A1* | 5/2017 | Kim | H01Q 9/42 |

FOREIGN PATENT DOCUMENTS

| | | |
|---|---|---|
| KR | 1020150115586 | 10/2015 |
| KR | 1020170035707 | 3/2017 |
| KR | 1020170053401 | 5/2017 |

OTHER PUBLICATIONS

PCT/ISA/237 Written Opinion issued on PCT/KR2018/009525, dated Nov. 27, 2018, pp. 7.

* cited by examiner

ELECTRONIC DEVICE COMPRISING ANTENNA DEVICE

CROSS-REFERENCE TO RELATED APPLICATION(S)

This application is a National Phase Entry of PCT international Application No. PCT/KR2018/009525, which was filed on Aug. 20, 2018, and claims priority to Korean Patent Application No. 10-2017-0174877 filed on Dec. 19, 2017 in the Korean Intellectual Property Office, the contents of each of which are incorporated herein by reference.

BACKGROUND

1. Field

Various embodiments relate to an electronic device. For example, various embodiments relate to an electronic device including an antenna device.

2. Description of the Related Art

As the degree of integration of electronic devices has increased and super-high speed and large capacity wireless communication has become popular, various functions have recently been provided in a single electronic device, such as a mobile communication terminal. For example, various functions, such as an entertainment function (e.g., a game function), a multimedia function (e.g., a music/video reproduction function), a communication and security function for mobile banking or the like, a schedule management function, and an e-wallet function, may be integrated in a single electronic device, in addition to a communication function.

Such an electronic device (e.g., a mobile communication terminal) may perform wireless communication by being provided with an antenna device. For example, an electronic device may be provided with various antenna devices (e.g., an antenna device for near-field communication (NFC) for a function of wireless charging, an electronic card, or the like, an antenna device for connection to a local area network (LAN) or the like, or an antenna device for connection to a commercial communication network). When various antenna devices are mounted in a single electronic device as described above, the electronic device may select a suitable antenna device according to a use environment or an operating mode so as to secure an optimum communication environment.

SUMMARY

In a miniaturized electronic device, such as a mobile communication terminal, it may be difficult to secure a space in which various types of antenna devices (e.g., radiation conductors) can be arranged. For example, even though it is possible to provide a stable operating environment by securing a predetermined distance between different electrically conductive components or structures and antenna devices, it may be difficult to secure such a distance or space in an electronic device miniaturized in consideration of portability. In an embodiment, if the housing of an electronic device is made of an electrically conductive material, for example, metal, a portion of the housing may be used as an antenna device. In such a case, for example, it is necessary to secure an insulation structure between the portion used as the antenna device and other portions, which may adversely affect the external appearance of the housing or the electronic device.

Various embodiments disclosed herein may provide an electronic device including an antenna device that can be easily formed and disposed even in a confined space.

Various embodiments disclosed herein may provide an electronic device including an antenna device that is disposed and concealed on an inner structure.

An electronic device according to various embodiments of the disclosure may include: a housing; an inner plate embedded in the housing and having at least a portion made of a synthetic resin material, wherein the inner plate includes a first surface, a second surface facing away from the first surface, a first through hole formed to have a cone-shaped cross section having a diameter that gradually decreases from the first surface toward the second surface, and a second through hole disposed adjacent to the first through hole and formed to have a cone-shaped cross section having a diameter that gradually decreases from the second surface toward the first surface; a first conductive line formed on the first surface and formed to at least partially overlap the first through hole when viewed from the first surface; a second conductive line formed on the second surface and formed to at least partially overlap the second through hole when viewed from the second surface; a first conductive layer deposited conformally on an inner wall of the first through hole and electrically connected to at least one of the first conductive line and the second conductive line; a second conductive layer deposited conformally on an inner wall of the second through hole and electrically connected to at least one of the first conductive line and the second conductive line; a wireless communication module electrically connected to at least one of the first conductive line and the second conductive line; and the first conductive line, the second conductive line, the first conductive layer, and the second conductive layer include the same composition.

According to various embodiments of the disclosure, an electronic device may include: a housing; an inner plate embedded in the housing and having at least a portion made of a synthetic resin material, wherein the inner plate includes a first surface, a second surface facing away from the first surface, and a plurality of through holes; a first conductive pattern formed on the first surface and overlapping the through holes when viewed from the first surface; a second conductive pattern formed on the second surface and overlapping the through holes when viewed from the second surface; conductive layers formed at least on the inner walls of the through holes, respectively; and a wireless communication module electrically connected to the first conductive pattern or the second conductive pattern. The first conductive pattern, the second conductive pattern, or the conductive layer may include the same composition.

An electronic device according to various embodiments of the disclosure may include: a housing; an inner plate accommodated in the housing and including an electrically conductive material region and an electrically insulative material region; a circuit board accommodated in a space surrounded by the housing and the inner plate; and conductive patterns, each printed on one of opposite surfaces of the inner plate in the electrically insulative material region of the inner plate. The circuit board and the conductive patterns may be electrically connected to each other.

According to various embodiments of the disclosure, conductive patterns used as antenna devices (e.g., radiation conductors) are formed by spraying and printing conductive ink, paint, or the like on an internal structure of an electronic device. Thus, the conductive patterns can be easily manufactured. For example, since the conductive patterns can be formed through a method of spraying or printing conductive ink, paint, or the like, it is easy to arrange the antenna devices even if an insulation region provided in the internal structure is somewhat confined.

In an embodiment, a conductive pattern formed through a spraying or printing method may improve assembly quality or freedom of appearance design of an electronic device.

According to various embodiments, by electrically connecting conductive patterns to a communication module or the like through a plurality of paths, for example, conductive layers formed in a plurality of through-holes, respectively, it is possible to provide a stable connection structure between the conductive patterns and the communication module.

DETAILED DESCRIPTION

Figure 1:
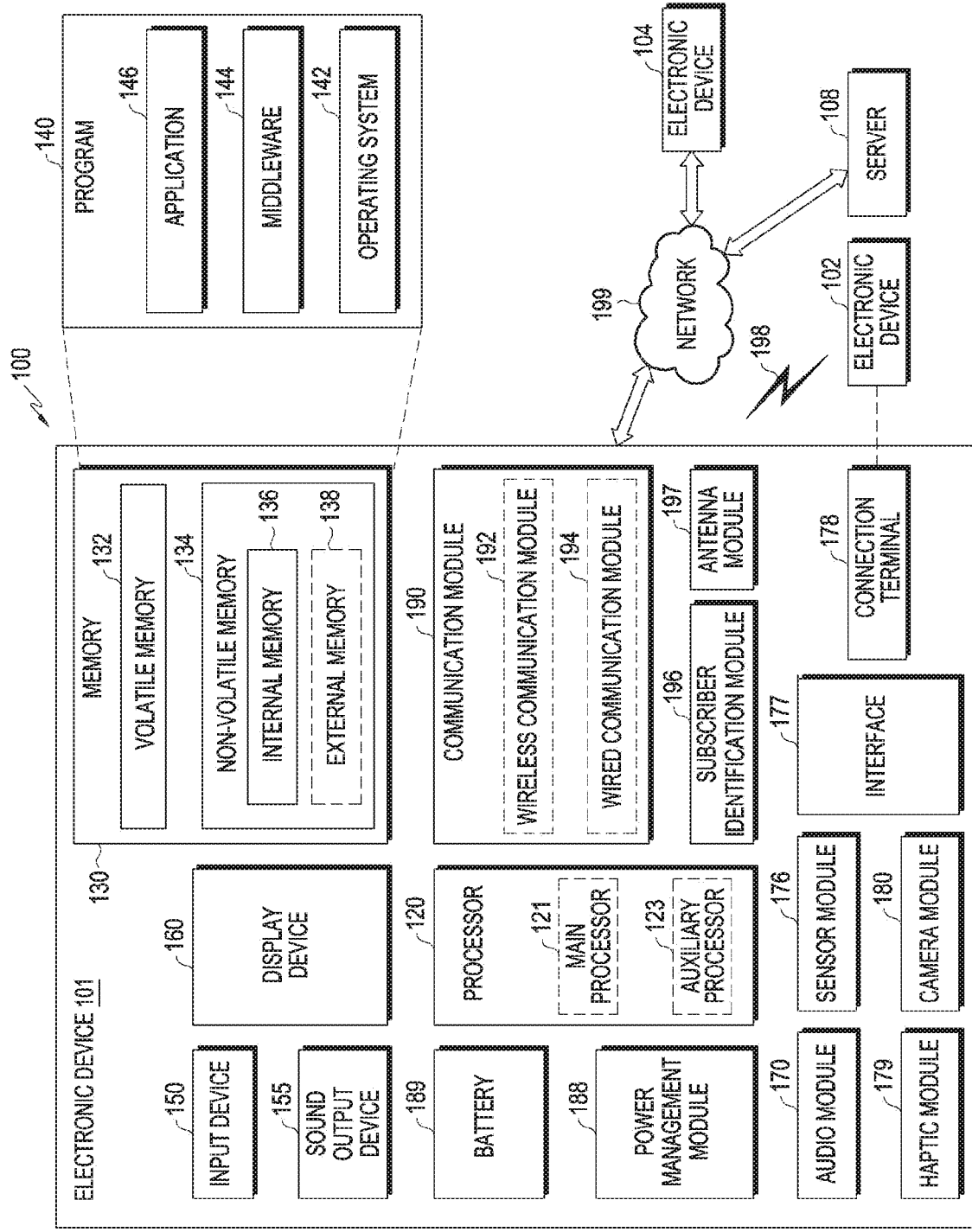
FIG. 1 is a block diagram illustrating an electronic device within a network environment, according to various embodiments of the disclosure.

Embodiments of the disclosure will be described herein below with reference to the accompanying drawings. However, the embodiments of the disclosure are not limited to the specific embodiments and should be construed as including all modifications, changes, equivalent devices and methods, and/or alternative embodiments of the disclosure.

Ordinal terms such as "first" or "second" may be used to describe, not limiting, various components. These expressions are used to distinguish one component from another component. For example, a first component may be referred to as a second component, and vice versa without departing from the scope of the disclosure. The term 'and/or' includes one or a combination of two or more of a plurality of enumerated items.

Relative terms described with respect to what is seen in the drawings, such as "front surface," "rear surface," "top surface," and "bottom surface" may substitute for ordinal numbers such as "first" and "second." The sequence of ordinal numbers such as "first" and "second" is determined in a mentioned order or an arbitrary order, and may be changed arbitrarily when needed.

The terms as used in the disclosure are provided to merely describe specific embodiments, not intended to limit the scope of the disclosure. It is to be understood that singular forms include plural referents unless the context clearly dictates otherwise. In the disclosure, the term "include" or "have" signifies the presence of a feature, number, operation, component, part, or a combination thereof described in the disclosure, not excluding the presence of one or more other features, numbers, operations, components, parts, or a combination thereof.

Unless otherwise defined, the terms and words including technical or scientific terms used herein may have the same meanings as generally understood by those skilled in the art. The terms as generally defined in dictionaries may be interpreted as having the same or similar meanings as or to contextual meanings of related technology. Unless otherwise defined, the terms should not be interpreted as ideally or excessively formal meanings.

In the disclosure, the electronic device may be an arbitrary device including a touch panel, and the electronic device may be referred to as a terminal, a portable terminal, a mobile terminal, a communication terminal, a portable communication terminal, a portable mobile terminal, and a display device.

For example, the electronic device may be a smartphone, a portable phone, a navigation device, a gaming device, a TV, a head unit for a vehicle, a notebook computer, a laptop computer, a tablet computer, a personal media player (PMP), and a person digital assistant (PDA). The electronic device may be implemented as a portable communication terminal of a pocket size, which has a wireless communication function. Further, the electronic device may be a flexible device or a flexible display device.

The electronic device may communicate with an external electronic device, such as a server, and may perform an operation in conjunction with an external electronic device. For example, the electronic device may transmit an image captured by a camera or location information detected by a sensor unit, to a server through a network. The network is not limited thereto, but may be a mobile or cellular communication network, a local area network (LAN), a wireless local area network (WLAN), a wide area network (WAN), the internet, and a small area network (SAN).

FIG. 1 is a block diagram illustrating an electronic device 101 in a network environment 100 according to various embodiments.

Figure 2:
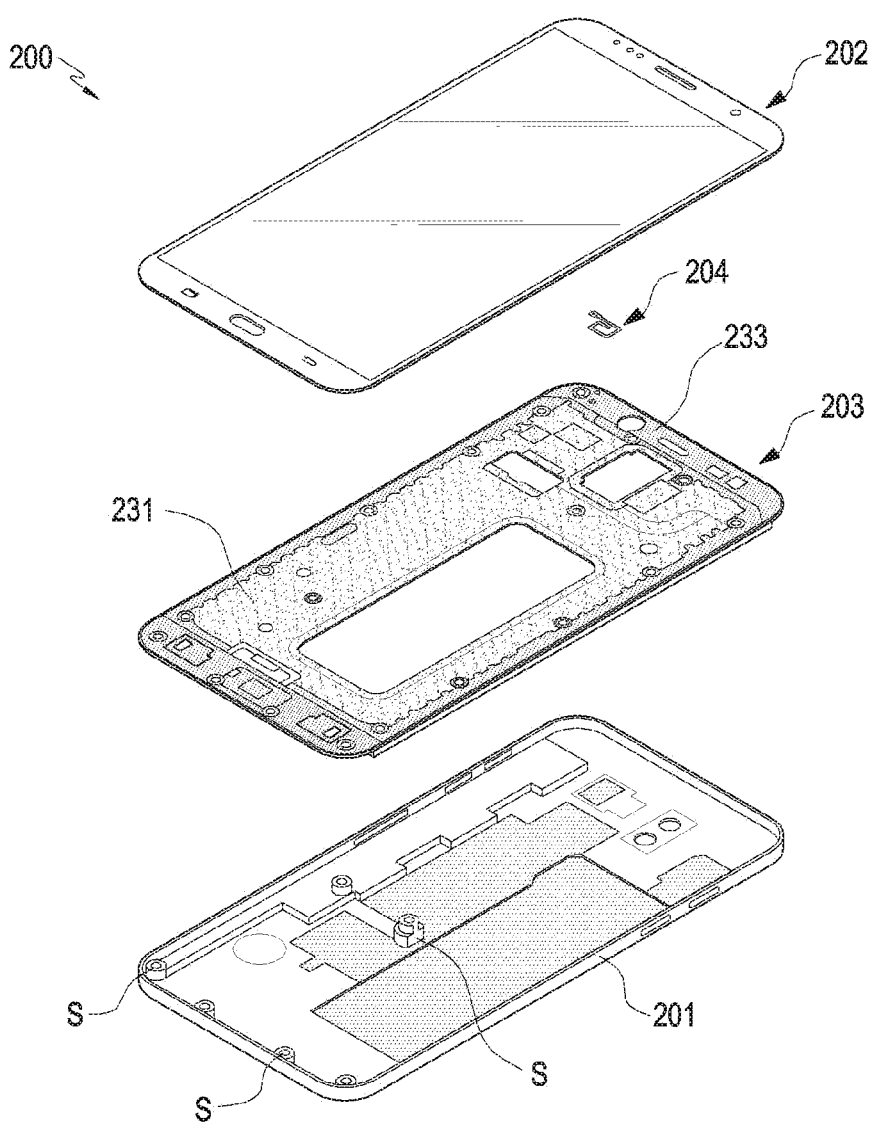
FIG. 2 is an exploded perspective view illustrating the electronic device according to various embodiments of the disclosure.

Referring to FIG. 1, the electronic device 101 in the network environment 100 may be, for example, the whole or part of an electronic device 200 of FIG. 2, and may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be integrated and implemented as in, for example, the sensor module 176 (e.g., a fingerprint sensor, an iris sensor, or an illuminance sensor) embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing and computation. The processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from the main processor 121. Additionally or alternatively, the auxiliary processor 123 may be adapted to consume less power than the main processor 121, or to be specific to a specified function. Here, the auxiliary processor 123 may be operated separately from or embedded in the main processor 121.

In such a case, the auxiliary processor 123 may control, for example, at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active (e.g., executing an application) state. According to an embodiment, the auxiliary processor 123 (e.g., an image signal processor or a communication processor) may be implemented as part of another component (e.g., the camera module 180 or the communication module 190) functionally related to the auxiliary processor 123. The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 is software stored in the memory 130, and may include, for example, an operating system (OS) 142, middleware 144, or an application 146.

The input device 150 is a device configured to receive a command or data to be used by other component (e.g., the processor 120) of the electronic device 101, from the outside (e.g., a user) of the electronic device 101, and may include, for example, a microphone, a mouse, or a keyboard.

The sound output device 155 is a device configured to output sound signals to the outside of the electronic device 101. The sound output device 155, and may include, for example, a speaker or a receiver. The speaker may be used for general purposes, such as playing multimedia or playing record, and the receiver may be used only for an incoming calls. According to an embodiment, the receiver may be implemented as separate from, or as part of the speaker.

The display device 160 is a device configured to visually provide information to a user of the electronic device 101, and may include, for example, a display, a hologram device, or a projector and control circuitry to control a corresponding one of the display, hologram device, and projector. According to an embodiment, the display device 160 may include touch circuitry or a pressure sensor adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or an external electronic device (e.g., an electronic device 102 (e.g., a speaker or a headphone)) wiredly or wirelessly coupled with the electronic device 101.

The sensor module 176 may generate an electrical signal or data value corresponding to an operational state (e.g., power or temperature) of the electronic device 101 or an environmental state external to the electronic device 101. The sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support specified protocols to be used for the electronic device 101 to be coupled with the external electronic device (e.g., the electronic device 102) wiredly or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102), for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 is a module configured to manage power supplied to the electronic device 101, and may be implemented as at least part of, for example, a power management integrated circuit (PMIC).

The battery 189 is a device configured to supply power to at least one component of the electronic device 101, and may include, for example, a primary cell which is not rechargeable, a secondary cell which is rechargeable, or a fuel cell.

The communication module 190 may support establishing a wired communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a wired communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules 190 may be implemented as a single chip, or may be implemented as separate chips, respectively.

According to an embodiment, the wireless communication module 192 may identify and authenticate the electronic device 101 in a communication network, using user information stored in the subscriber identification module 196.

The antenna module 197 may include at least one antenna module for transmitting or receiving a signal or power to or from the outside of the electronic device 101. According to an embodiment, the communication module 190 (e.g., the wireless communication module 192) may transmit or receive a signal to or from the external electronic device via an antenna appropriate for a communication scheme.

FIG. 2 is an exploded perspective view illustrating the electronic device 200 according to various embodiments of the disclosure Referring to FIG. 2, the electronic device 200 (e.g., the electronic device 101 in FIG. 1) according to various embodiments of the disclosure may include a housing 201, an inner plate 203 embedded in the housing 201, a conductive pattern (e.g., a first conductive line (or a first conductive pattern) 204, or a second conductive line (or a second conductive pattern)) 441 formed on at least one surface of the inner plate 203. In an embodiment, if a conductive pattern is formed on each of opposite surfaces of the inner plate 203, the electronic device 200 may include a plurality of through holes (e.g., a first through hole 343a or a second through hole 343b in FIG. 5) penetrating the inner plate 203, and a conductive layer (e.g., a first conductive layer 545a or a second conductive layer 545b in FIG. 5) formed in each of the through holes. In some embodiments, the conductive layers may electrically connect the conductive patterns formed on the opposite surfaces of the inner plate 203, for example, the first conductive pattern 204 in FIG. 5 and the second conductive pattern 441 in FIG. 5. The conductive patterns may be electrically connected to a communication module of the electronic device 200 (e.g., the wireless communication module 192 in FIG. 1), and the electronic device 200 or the communication module may transmit/receive a wireless signal via the conductive patterns 204 and 441 (or the conductive layers or the like). For example, the conductive pattern 204 may be used as an antenna device (e.g., the antenna module 197 in FIG. 1) of the electronic device 200.

According to various embodiments, the housing 201 may be at least partially made of a metallic material, for example, an electrically conductive material. As described above, a portion of the housing 201 may be used as an antenna device, for example, a radiation conductor. According to an embodiment, the housing 201 substantially forms the appearance of the electronic device 200 and accommodates various electronic components. A display device 202 is mounted on one surface of the housing 201, and may close the inner space of the housing 201 (e.g., the space in which various electronic components are accommodated).

According to various embodiments, the electronic device 200 may include an inner structure S disposed inside the housing 201. The inner structure S may provide a means for mounting and fixing an electronic component accommodated inside the housing 201, the inner plate 203, a circuit board (e.g., the circuit board 1105 in FIG. 11) to be described later, or the like. For example, the inner plate 203 may include a fastening hole (e.g., the fastening hole 335 in FIG. 3), and the inner structure S may include a fastening boss (an engaging boss) corresponding to the fastening hole 335. In some embodiments, a fastening element such as a screw may be fastened to the fastening hole 335 and the fastening boss, and a portion of the circuit board may be restrained and fixed between the inner plate 203 and the inner structure S (e.g., the fastening boss). According to an embodiment, the inner plate 203 may include a protrusion (not illustrated) formed around the fastening hole 335 so as to prevent the inner plate 203 from coming into direct contact with the circuit board. For example, the circuit board coupled to face the inner plate 203 may be supported by the protrusion formed on the inner plate 203.

According to various embodiments, the display device 202 (e.g., the display device 160 in FIG. 1) may include a display panel that outputs a screen, and may detect a user's touch input, drag input, hovering input, or the like by including a touch panel. For example, the display device 202 is an output device that provides visual information such as videos, images, and text, and may be used as an input device (e.g., the input device 150 in FIG. 1) that detects user input. In an embodiment, the display device 202 may be mounted on the housing 201 while being supported by the inner plate 203. In another embodiment, a part of the sensor module 176 in FIG. 1 described above, for example, a proximity sensor or an illuminance sensor, may be disposed on the display device 202. For convenience of description, hereinafter, the surface on which the display device 202 is mounted (or the outer surface of the display device 202) may be referred to as a "front surface of the electronic device 200 (or the housing 201)", and the opposite surface may be referred to as a "rear surface of the electronic device 200 (or the housing 201)".

According to various embodiments, the inner plate 203 may be accommodated inside the housing 201 in the state of being bonded to the display device 202. The inner plate 203 may include, for example, an electrically conductive material 231 (e.g., magnesium) region and an electrically insulative material (e.g., synthetic resin) region 233. In an embodiment, the inner plate 203 may spatially separate (isolate) the display device 202 with respect to the electronic components accommodated in the housing 201, and may provide an electromagnetic shielding environment for each electronic component. In another embodiment, the electrically conductive material region 231 of the inner plate 203 may be made of a metallic material so as to improve the stiffness of the electronic device 200 and to be used as a grounding conductor. For example, the inner plate 203 may improve the structural and electrical stability of the electronic device 200.

According to various embodiments, the electronic device 200 may transmit/receive a wireless signal through one or more conductive patterns 204 formed on one surface of the inner plate 203. For example, the conductive patterns 204 may be used as antenna devices (e.g., the antenna module 197 in FIG. 1). In an embodiment, in addition to the antenna devices made of the conductive patterns 204, the electronic device 200 may include an antenna device formed by a portion of the housing 201, an antenna device attached to the inner surface of the housing 201, an antenna device formed as a printed circuit pattern implemented in a circuit board (e.g., a circuit board accommodated in a space surrounded by the inner plate 203 and the housing 201), and the like.

According to various embodiments, the conductive patterns 204 may be formed by spraying and printing conductive ink or paint on at least one surface in the electrically insulative material region 233 of the inner plate 203. For example, the conductive patterns 204 may be completed by drying or curing the sprayed or printed conductive ink or paint. In some embodiments, some or all of the conductive patterns 204 may be formed in the electrically conductive material region 231 of the inner plate 203. According to various embodiments, in forming the conductive patterns 204 by spraying or printing a conductive ink or paint, the ink or paint may be stably attached in a flat region or a region having a sufficient curvature even if the region is in the form of a curved surface. In an embodiment, a first surface of the inner plate 203 (e.g., the surface facing the display device 202) may include a flat region for attaching the display device 202, and the conductive patterns 204 may be formed in a flat region on the first surface of the inner plate 203. In some embodiments, if the flat region of the inner plate 203 corresponds to the electrically conductive material region, an insulation layer (e.g., the insulating layer 1141 in FIG. 11) may be formed in the region in which the conductive patterns 204 are formed, and the conductive patterns 204 may be formed on the surface of the insulation layer in the electrically conductive material region of the inner plate 203.

A structure for forming the conductive patterns 204 will be described in more detail with reference to FIG. 3 and the like.

Figure 3:
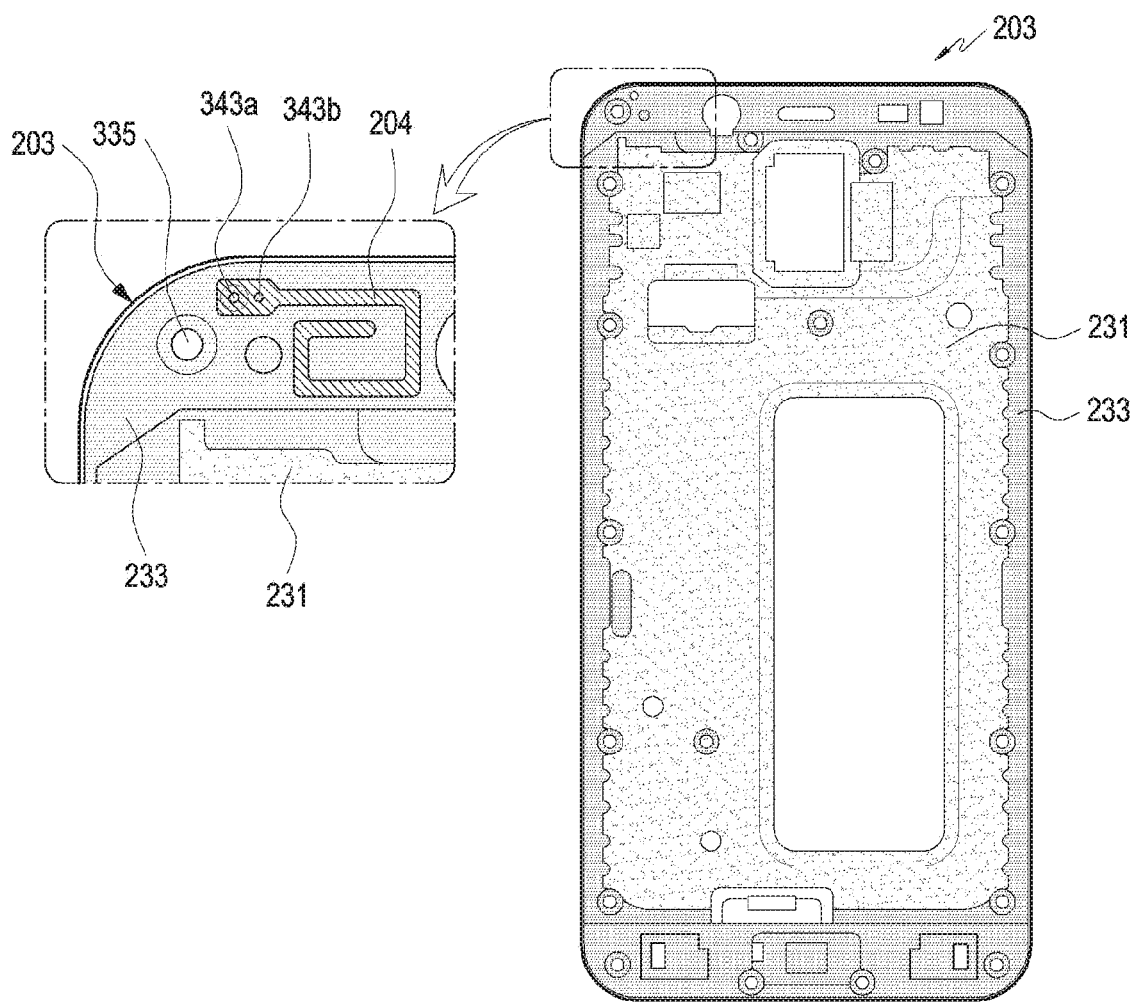
FIG. 3 is a view for describing one of conductive patterns of an electronic device according to various embodiments of the disclosure.
Figure 4:
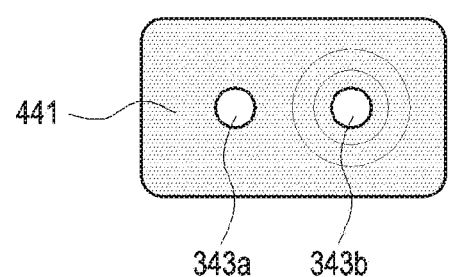
FIG. 4 is a view for describing another one of conductive patterns of an electronic device according to various embodiments of the disclosure.

FIG. 3 is a view for describing one of conductive patterns 204 of an electronic device according to various embodiments of the disclosure. FIG. 4 is a view for describing another one 441 of conductive patterns of an electronic device according to various embodiments of the disclosure.

Referring to FIGS. 3 and 4, conductive lines, for example, the conductive patterns 204 and 441, may include a first conductive pattern 204 formed on a first surface of the inner plate 203 (e.g., the surface facing the display device 202) and a second conductive pattern 441 formed on a second surface of the inner plate 203 (e.g., the surface facing away from the first surface). Each of the first conductive pattern 204 and the second conductive pattern 441 may be formed in the electrically insulative material region 233 on the inner plate 203. When projected from the first surface or the second surface, at least a portion of the second conductive pattern 441 may overlap a portion of the first conductive pattern 204.

According to various embodiments, the inner plate 203 may include a plurality of through holes 343*a* and 343*b* formed to penetrate from the first surface to the second surface (or vice versa), and the first conductive pattern 204 and the second conductive pattern 441 may be electrically connected through the through holes 343*a* and 343*b*. According to an embodiment, the through holes 243 may be formed to overlap the first conductive pattern 204 or the second conductive pattern 441. In an embodiment, when viewed from the first surface of the inner plate 203, the first conductive pattern 204 may be formed to at least partially overlap the first through hole 343*a* or the second through hole 343*b* among the through holes. In another embodiment, when viewed from the second surface of the inner plate 203, the second conductive pattern 441 may be formed to at least partially overlap the first through hole 343*a* or the second through hole 343*b* among the through holes.

Here, since a "through hole" substantially corresponds to an open space or region, it may not actually overlap another component. In various embodiments of the disclosure, when it is described that "a through hole overlaps a conductive pattern" or "a conductive pattern overlaps a through hole", it may mean that the conductive pattern is formed to substantially include the region in which the through hole is formed, and that the through hole is positioned to at least partially penetrate the conductive pattern when viewed from one surface (the first surface or the second surface) of the inner plate.

A structure in which the first conductive patterns 204 and the second conductive pattern 441 are electrically connected will be described in more detail with reference to FIG. 5 and the like.

Figure 5:
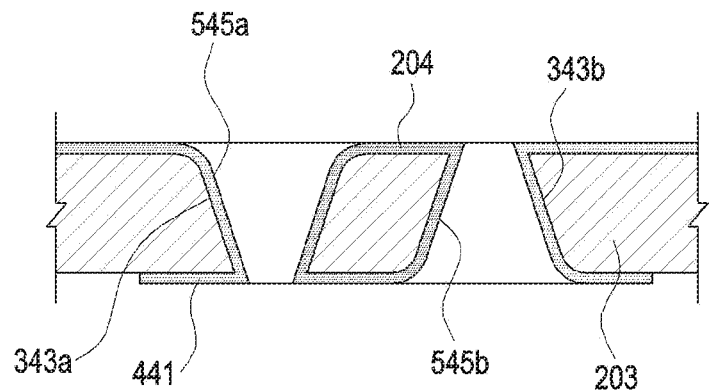
FIGS. 5 to 7 are views each illustrating conductive layers of an electronic device according to various embodiments of the disclosure.
Figure 6:
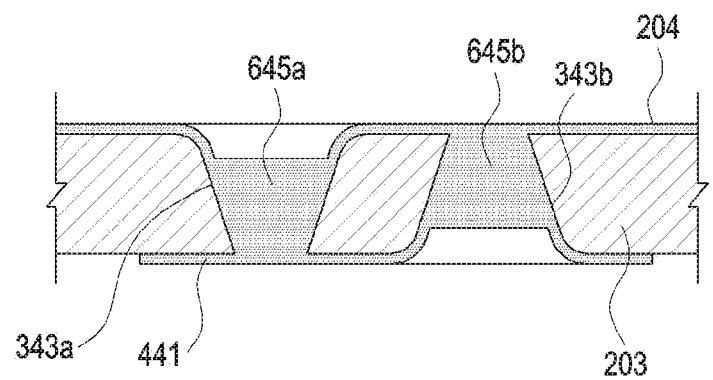
Figure 7:
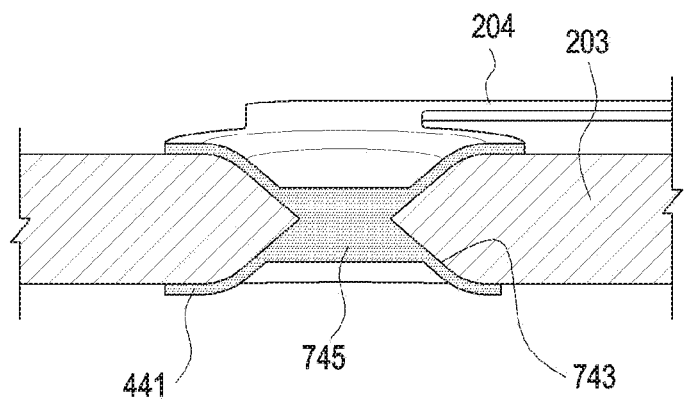

FIGS. 5 to 7 are views illustrating conductive layers 545*a*, 545*b*, 645*a*, 645*b*, and 745 of an electronic device according to various embodiments of the disclosure by way of an example.

According to various embodiments, the conductive layers 545*a*, 545*b*, 645*a*, 645*b*, and 745 may be formed at least on the inner walls of the through holes 343*a*, 343*b*, and 743, respectively, and the first conductive pattern 204 and the second conductive pattern 441 may be electrically connected through the conductive layers 545*a*, 545*b*, 645*a*, 645*b*, and 745. In various embodiments of the disclosure, the conductive layers 545*a*, 545*b*, 645*a*, 645*b*, and 745 are described separately from the first conductive pattern 204 or the second conductive pattern 441. However, the conductive layers 545*a*, 545*b*, 645*a*, 645*b*, and 745 may be substantially a portion of the first conductive pattern 204 or the second conductive pattern 441, and may include a composition that is the same as that of the first conductive pattern 204 or the second conductive pattern 441. For example, in the process of printing the first conductive pattern 204 or the second conductive pattern 441, conductive ink or paint is also attached to the inner walls of the through holes 343*a*, 343*b*, and 743. Thus, the conductive layers 545*a*, 545*b*, 645*a*, 645*b*, and 745 may be formed to have a substantially uniform thickness, which is the same as that of the first conductive pattern 204 or the second conductive pattern 441.

In an embodiment, the composition (e.g., conductive ink) that is printed or sprayed so as to form the first conductive pattern 204 or the like may include at least one of, for example, copper, gold, silver, or a graphene component. The component ratios or the like of the above-described composition may be appropriately adjusted in consideration of, for example, adhesion to the inner plate 203, shape retention after attachment (before curing) while being printable and sprayable, and an electric resistance value after curing as the first conductive pattern 204.

Referring to FIG. 5, each of the through holes 343*a* and 343*b* has a diameter that may gradually change from the first surface of the inner plate 203 (e.g., the top surface of the inner plate 203 in FIG. 5) toward the second surface (or from the second surface toward the first surface). According to an embodiment, among the through holes, the first through hole 343a may become smaller in diameter from the first surface of the inner plate 203 toward the second surface, and the second through hole 343b may become smaller in diameter from the second surface of the inner plate 203 toward the first surface. For example, each of the through holes 243 may have a cone-shaped or a truncated-cone-shaped cross section, some of the through holes 343a and 343b (e.g., the first through hole 343a) may have a larger diameter on the first surface of the inner plate 203, and remaining ones of the through holes (e.g., the second through hole 343a) may have a larger diameter on the second surface of the inner plate 203.

According to an embodiment, the shapes of the through holes 343a, 343b, and 743 may stabilize the formation of the conductive layers 545a, 545b, 645a, 645b, and 745. For example, while forming the first conductive pattern 204 on the first surface of the inner plate 203, the conductive layers 545a, 545b, 645a, and 645b may be easily formed in the through holes (e.g., the first through hole 343a) having a larger diameter on the first surface of the inner plate 203. For example, when forming the first conductive pattern 204, conductive ink can be easily attached to the through holes having a larger diameter on the first surface of the inner plate 203. In another embodiment, while forming the second conductive pattern 441 on the second surface of the inner plate 203, the conductive layer 245 can be easily formed in the through holes (e.g., the second through hole 343b) having a larger diameter on the second surface of the inner plate 203. For example, when forming the second conductive pattern 441, conductive ink can be easily attached to the through holes having a larger diameter on the second surface of the inner plate 203. For example, the conductive layers 545a, 545b, 645a, 645b, and 745 may be formed substantially simultaneously when forming the first conductive pattern 204 or the second conductive pattern 441, and the composition thereof may be the same as that of the first conductive pattern 204 or the second conductive pattern 441.

According to an embodiment, the first conductive pattern 204 or the second conductive pattern 441 may be formed through a plating method. For example, after laser processing is performed along the trajectory of a conductive pattern to be formed in the electrically insulative material region 233 of the inner plate 203, plating may be performed to form the first conductive pattern 204 or the second conductive pattern 441 on the surface processed by the laser. This plating method may be useful for mass production, but when the inner plate 203 includes an electrically conductive material region 231, the plating method may be somewhat limited. For example, a metal material may be attached to the electrically conductive material region 231 or the electrically conductive material region 231 may be corroded during the plating process. For example, a conductive pattern may be formed through plating method, but when the inner plate 203 includes an electrically conductive material region, the plating process may be limited. According to various embodiments of the disclosure, the first conductive pattern 204 or the second conductive pattern 441 may be easily formed in the electrically insulative material region 233 of the inner plate 203 using a printing or spraying method, and the first conductive pattern 204 or the second conductive pattern 441 may be insulated from the electrically conductive material region 231 of the inner plate 203.

Referring to FIG. 6, in forming conductive layers 645a and 645b connecting the first conductive pattern 204 and the second conductive pattern 441 to each other, the conductive layers 645a and 645b may be formed to close the through holes 343a and 343b. For example, the conductive layers 645a and 645b may fill at least a portion of the through hole 343a and at least a portion of the through hole 343b, respectively, and after curing, may close the through holes 643a and 643b, respectively.

In a cross-sectional view, the through-holes may have various shapes. Referring to FIG. 7, a through hole 743 penetrating the inner plate 203 (e.g., the electrically insulative material region 233) may have the smallest diameter in the intermediate portion between the top surface of the inner plate 203 (e.g., the first surface facing the display device 202 in FIG. 2) and the bottom surface (e.g., the second surface facing away from the first surface). The conductive layer 745 formed inside the through hole 743 may be formed on at least a portion of the inner wall of the through hole 743, and in some embodiments, the conductive layer 745 may close the through hole 743.

According to various embodiments, as illustrated in FIG. 6 or FIG. 7, the conductive layers 545a, 545b, 645a, 645b, and 745 may form sealing structures within the through holes 343a, 343b, and 743. For example, even if a hole penetrating the first and second surfaces of the inner plate 203 is formed, some conductive layers (e.g., the conductive layers denoted by reference numerals "645a", "645b", and "745") may form sealing structures. In some embodiments, the sealing structures formed by the conductive layers are capable of blocking entry of foreign substances (e.g., moisture) into the electronic device (e.g., the electronic device 200 in FIG. 2), or even if a portion of the inner portion of the electronic device is contaminated, the sealing structures are capable of preventing the contamination from spreading.

Figure 8:
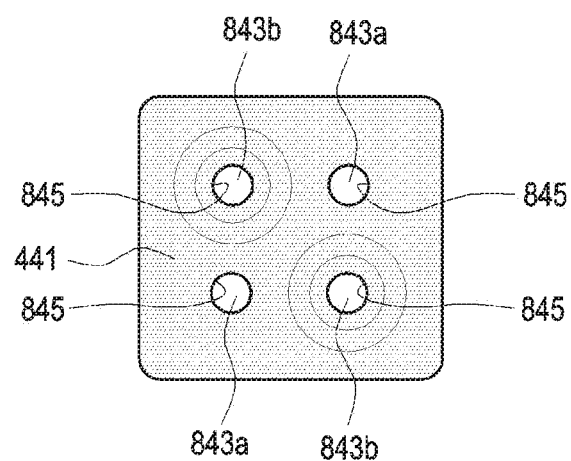
FIG. 8 is a view for describing a modification of another one of conductive patterns of an electronic device according to various embodiments of the disclosure.

FIG. 8 is a view for describing a modification of another one of conductive patterns of an electronic device according to various embodiments of the disclosure.

Referring to FIG. 8, an electronic device (e.g., the electronic device 200 in FIG. 2) according to various embodiments of the disclosure may have a larger number of through holes 843a and 843b formed to penetrate both surfaces of the inner plate (e.g., the inner plate 203 in FIG. 3). The first conductive pattern 204 and the second conductive pattern 441 are electrically connected to each other through conductive layers 845 (e.g., the conductive layers 545a and 545b in FIG. 5) formed in, for example, the through holes 843a and 843b. As the number of through holes 843a and 843b connecting the first conductive pattern 204 and the second conductive pattern 441 increases, it is possible to connect the first conductive pattern 204 and the second conductive pattern 441 more stably. For example, the inner plate 203 is provided as a structure capable of improving the structural strength of the electronic device 200 so as to absorb and disperse an impact applied from the outside. The conductive layer 845 formed through a printing or curing method may be cracked by the impact. Therefore, if a larger number of through holes 843a and 843b (or a conductive layer 845) are provided, even if some of the conductive layers are damaged, the first conductive pattern 204 may remain electrically connected to the second conductive pattern 441 through the conductive layers of other through holes.

Figure 9:
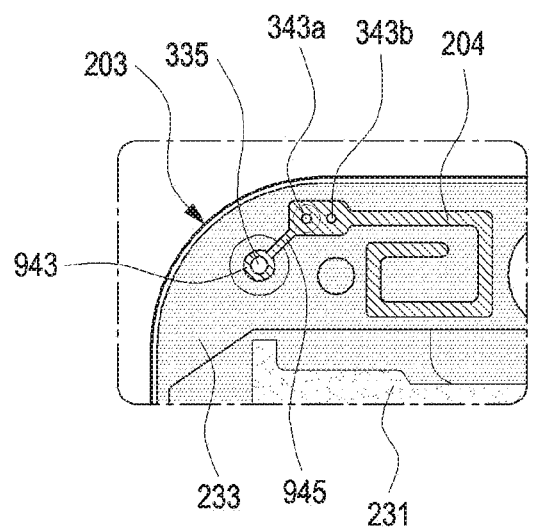
FIG. 9 is a view for describing a modification of one of conductive patterns of an electronic device according to various embodiments of the disclosure.

FIG. 9 is a view for describing a modification of one of conductive patterns of an electronic device according to various embodiments of the disclosure.

Referring to FIG. 9, the inner plate 203 may include a plurality of fastening holes 335 formed at appropriate intervals, and at least one of the fastening holes (e.g., the fastening holes 335) may be positioned adjacent to the through holes 343a and 343b. According to an embodiment, the first conductive pattern 204 and the second conductive pattern 441 may also be electrically connected through a fastening hole 335. For example, while printing the first conductive pattern 204 or the like, a third conductive layer 943 may be formed on at least a portion of the inner wall of the fastening hole 335. According to an embodiment, if the fastening hole 335 is spaced apart from the first conductive pattern 204 or the conductive layer (e.g., conductive layers 545a and 545b in FIG. 5) by a predetermined distance, the third conductive layer 943 may be electrically connected to the first conductive pattern 204 or the conductive layer (e.g., the conductive patterns 545a and 545b in FIG. 5 or the conductive patterns 204 and 441) through a fourth conductive layer 945 formed on one surface or each of opposite surfaces of the inner plate 203. According to an embodiment, the fourth conductive layer 945 may printed simultaneously when the first conductive pattern 204 or the second conductive pattern 441 is printed.

Figure 10:
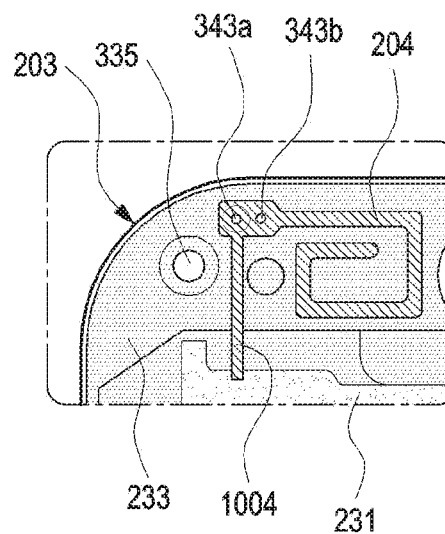
FIG. 10 is a view for describing a modification of still another one of conductive patterns of an electronic device according to various embodiments of the disclosure.
Figure 11:
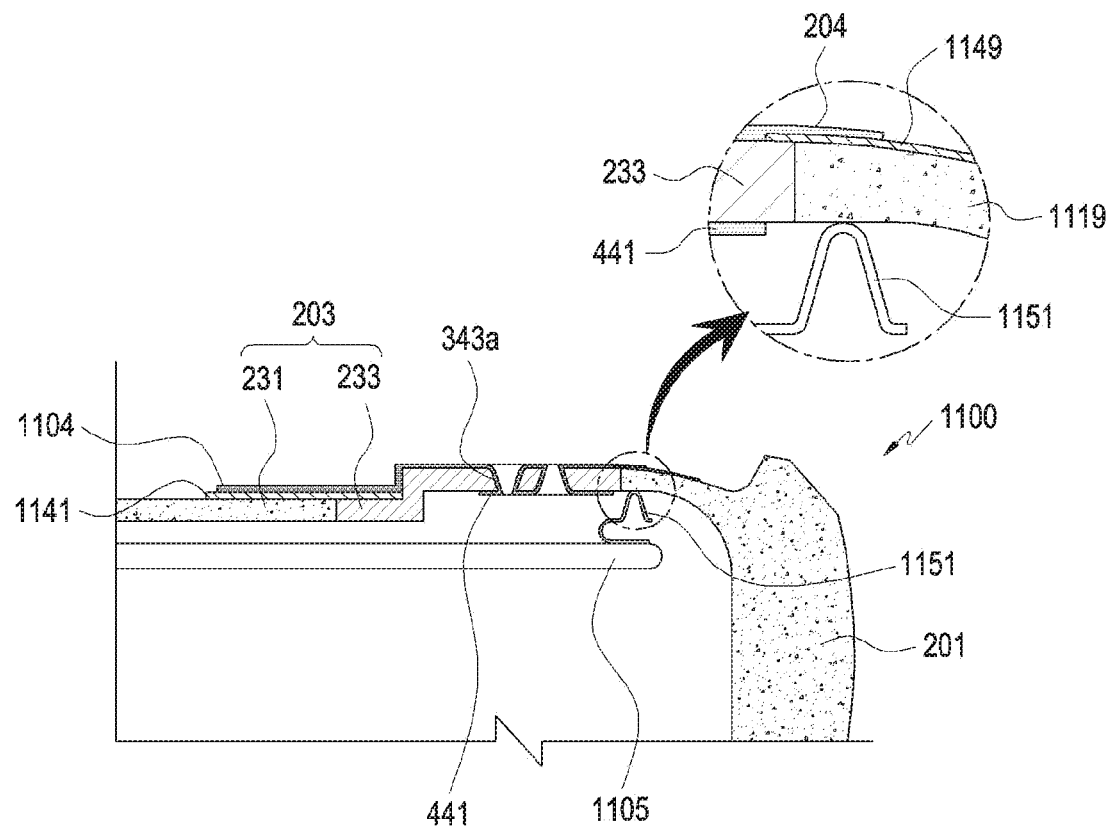
FIG. 11 is a cross-sectional view for describing a modification of still another one of conductive patterns of an electronic device according to various embodiments of the disclosure.

FIG. 10 is a view for describing a modification of still another one of conductive patterns of an electronic device according to various embodiments of the disclosure. FIG. 11 is a cross-sectional view for describing a modification of still another one of conductive patterns of an electronic device according to various embodiments of the disclosure.

Referring to FIGS. 10 and 11, the electronic device 300 (e.g., the electronic device 200 in FIG. 2) may include additional conductive patterns (hereinafter, referred to as "third conductive patterns 1004 and 1104") disposed in the electrically conductive material region 231 of the inner plate 203. According to an embodiment, the third conductive patterns 1004 and 1104 may be a portion of the first conductive pattern 204 or a portion of the second conductive pattern 441. In forming the third conductive patterns 1004 and 1104 in the electrically conductive material region 231, an insulation structure may be provided between the electrically conductive material region 231 and the third conductive patterns 1004 and 1104. For example, an insulation layer 1141 may be formed on at least the electrically conductive material region 231 in a portion where the third conductive patterns 1004 and 1104 are to be formed. According to some embodiments, the insulation layer 1141 may be formed from the electrically conductive material region 231 to the electrically insulative material region 233, and the third conductive patterns 1004 and 1104 may be formed on the insulation layer 1141 or the surface of the insulation layer 1141 in at least the electrically conductive material region 231.

According to various embodiments, the electronic device 1100 may include a circuit board 1105 accommodated in a space surrounded by the housing 201 and the inner plate 203. For example, the circuit board 1105 may be disposed to face the second surface of the inner plate 203. In an embodiment, the circuit board 1105 may include a contact terminal 1151 (e.g., a C-clip) electrically connected to an integrated circuit chip on which a communication module, for example, the wireless communication module 192 in FIG. 1, is mounted. At least one of the conductive patterns 204, 241, 1004, and 1104 is connected to the wireless communication module 192 through the contact terminal 1151, and may be used as a radiation conductor, for example, an antenna.

According to various embodiments, the first conductive pattern 204 may be electrically connected to the contact terminal 1151 through the electrically conductive material region of the housing 201 or the inner plate 203. Referring to FIG. 11, the electrically conductive material region 231 of the inner plate 203 may be mechanically connected and coupled to the housing 201 through the electrically insulative material region 233. In an embodiment, some of the inner structures of the housing 201 may have a protruding structure so as to form a portion of the inner plate 203 or to be engaged with the inner plate 203. In some embodiments, a structure 1119 protruding inside the housing 201 may include an electrically conductive material, and a portion of the first conductive pattern 204 may be positioned in the electrically conductive material portion of the housing 201. On the second surface of the inner plate 203, the contact terminal 1151 may be disposed to be in contact with the electrically conductive material portion (e.g., the protruding structure 1119) of the housing 201, and a portion of the first conductive pattern 204 may be formed on the electrically conductive material portion of the housing 201 so as to be electrically connected to the contact terminal 1151. In various embodiments of the disclosure, a portion in which the first conductive pattern 204 is formed is described as a portion of the housing 201 (e.g., the inwardly protruding structure 1119), but it is noted that the disclosure is not limited thereto. For example, it may be understood that a portion which protrudes inside the housing 201 and in which a portion of the first conductive pattern 204 is formed substantially forms a portion of the inner plate 203.

According to various embodiments, the electronic device 1100 may further include an anti-corrosion layer 1149 formed at a contact portion between the first conductive pattern 204 and the electrically conductive material portion of the housing 201. In the state in which different types of metals are in contact with each other, galvanic corrosion may occur due to a potential difference or the like. For example, the composition forming the first conductive pattern 204 and the metal material (or component) of the electrically conductive material portion (e.g., the protruding structure 1119) of the housing 201 may be different from each other. In this case, galvanic corrosion may occur at a portion where the first conductive pattern 204 is in contact with the electrically conductive material portion of the housing 201. The anti-corrosion layer 1149 may be formed at least partially on the surface of the electrically conductive material portion of the housing 201, for example, between the protruding structure 1119 and the first conductive pattern 204, and at least a portion of the first conductive pattern 204 may be formed on the surface of the anti-corrosion layer 1149. For example, the first conductive pattern 204 may be electrically connected to the electrically conductive material portion of the housing 201 or the contact terminal 1151 through the anti-corrosion layer 1149 while the first conductive pattern 204 does not come into direct contact with the electrically conductive material portion of the housing 201. In an embodiment, the anti-corrosion layer 1149 is a layer containing graphene (e.g., a layer containing graphene as a main component), and may electrically connect the first conductive pattern 204 to the contact terminal 1151. In some embodiments, such an anti-corrosion layer described above may also be provided between the contact terminal 1151 and the structure 1119 protruding inside the housing 201.

Figure 13:
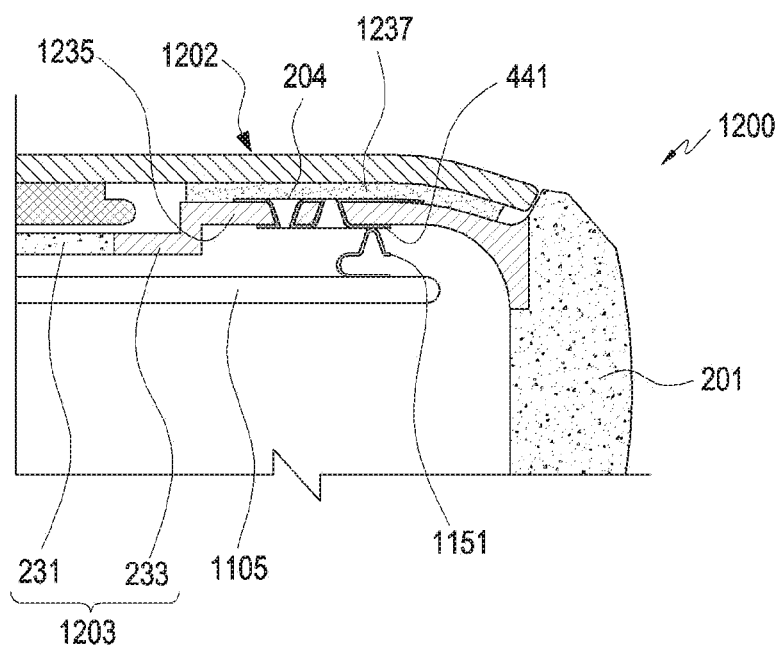
FIG. 13 is a cross-sectional view illustrating a modification of an electronic device according to various embodiments of the disclosure.

According to an embodiment, as will be described in more detail with reference to FIG. 13 and the like, at least a portion of the second conductive pattern 441 may be disposed to face a portion of the circuit board 1105, and inside the housing 201, the second conductive pattern 441 may be in electrical contact with the contact terminal 1151. For example, since the second conductive pattern 441 is in electrical contact with the contact terminal 1151, the first conductive pattern 204, the second conductive pattern 441, the third conductive pattern 1004 or 1104, the conductive layer 245, or the like may be electrically connected to a communication module (e.g., the communication module 192 in FIG. 1) of the circuit board 1105. The conductive patterns 204, 441, 1004, and 1104 or the conductive layers (e.g., conductive layers 545*a* and 545*b* in FIG. 5) described above may substantially form at least a portion of an antenna (e.g., the antenna module 197 in FIG. 1). The electronic device 1100 or the communication module of the circuit board 1105 may transmit/receive wireless signals through the conductive patterns 204, 441, 1004, and 1104, or the conductive layers.

A configuration in which the contact terminal 1151 is in contact with and is connected to the second conductive pattern 441 will be further described with reference to FIGS. 12 and 13.

Figure 12:
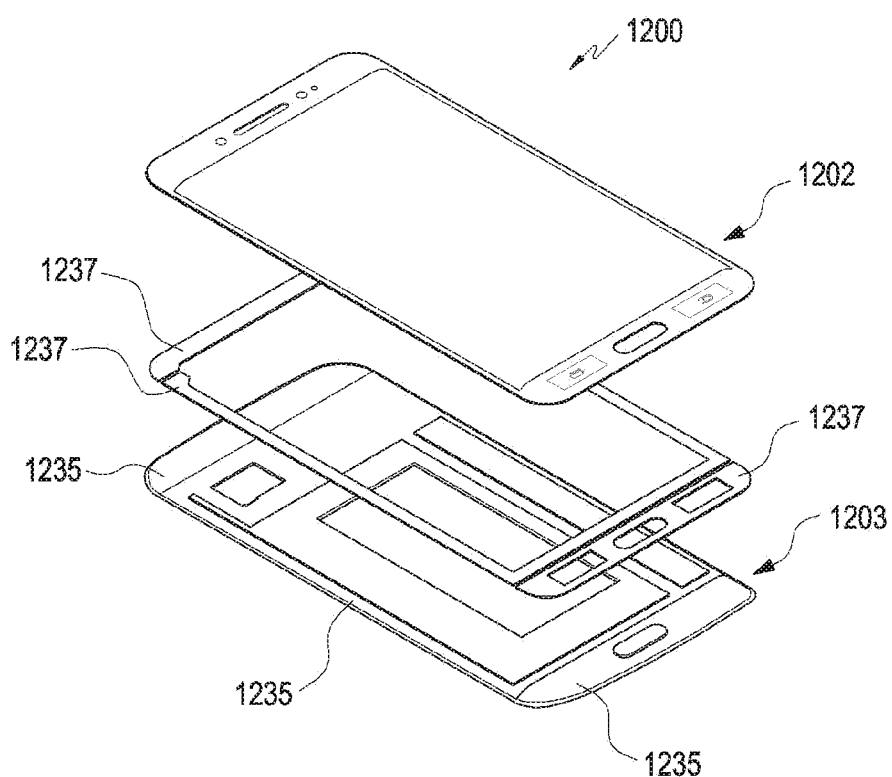
FIG. 12 is an exploded perspective view illustrating a modification of an electronic device according to various embodiments of the disclosure.

FIG. 12 is an exploded perspective view illustrating a modification of an electronic device according to various embodiments of the disclosure. FIG. 13 is a cross-sectional view illustrating a modification of an electronic device 1200 according to various embodiments of the disclosure.

According to an embodiment, as will be described in more detail with reference to FIGS. 12 and 13, at least a portion of the second conductive pattern 441 may be disposed to face a portion of the circuit board 1105, and in the housing 201, for example, on the second surface of the inner plate 203, the second conductive pattern 441 may be in electrical contact with the contact terminal 1151. In some embodiments, in consideration of the materials of the second conductive pattern 441 and the contact terminal 1151, if necessary, an anti-corrosion layer (e.g., the anti-corrosion layer 1149 in FIG. 11) may be further formed so as to prevent galvanic corrosion that may occur between the second conductive pattern 441 and the contact terminal 1151. In another embodiment, if the second conductive pattern 441 and the contact terminal 1151 are capable of forming an electrical coupling, for example, a capacitive coupling, therebetween, the anti-corrosion layer between the second conductive pattern 441 and the contact terminal 1151 may be formed of an insulation layer.

According to various embodiments, the electronic device 1200 (e.g., the electronic device 200 in FIG. 2) may include one or more bonding members 1237 that bond the display device 1202 to the inner plate 1203. The numbers and shapes of the bonding members 1237 may vary depending on the design of the bonding regions 1235 to be described later. According to one embodiment, the bonding members 1237 may be attached between the display device 1202 and the inner plate 1203 along the periphery edge of the first surface of the inner plate 1203. In some embodiments, the bonding members 1237 may form a waterproof structure between the inner plate 1203 and the display device 1202. According to an embodiment, the bonding members 1237 are capable of providing a sufficient bonding force by being attached to a flat surface having a predetermined width (e.g., the length measured inward from the periphery of the inner plate 1203) or a surface having a fairly large curvature to be substantially similar to a flat surface even if the surface is a curved surface. In some embodiments, there may be provided a single bonding member 1237 or multiple bonding members 1237.

According to various embodiments, the bonding region 1235 described above is useful in forming the above-described conductive patterns (e.g., conductive patterns 204 and 441 in FIGS. 5 to 7) through a printing or spraying method. For example, in attaching conductive ink or the like to a structure through a printing or spraying method, when the attachment portion (e.g., the printing region) is narrow or a large number of curves are provided, the adhesion is low and it may be difficult to form a conductive pattern of a continuous trajectory. According to various embodiments of the disclosure, the first conductive pattern 204 or the second conductive pattern 441 may be formed in the bonding region 1235 described above.

In an embodiment, since the first conductive pattern 204 or the second conductive pattern 441 formed through printing or spraying is formed to have a thickness less than a few tens of micrometers, the bonding force of the display device 1202 or the like may not be substantially affected. For example, by forming the conductive patterns through a printing or spraying method, it is possible to secure an additional antenna device or a region in which an antenna device can be installed without affecting the thickness or assembly quality of the electronic device 1200. In some embodiments, a pattern groove having a predetermined depth (e.g., tens of micrometers) is formed along a trajectory in which the first conductive pattern 204 or the second conductive pattern 441 is formed in the bonding region 1235 described above, and the first conductive pattern 204 or the second conductive pattern 441 may be formed in the pattern groove. This enables formation of a thicker conductive pattern without affecting the thickness or assembly quality of the electronic device 1200, and is capable of reducing the line resistance of the conductive pattern to improve energy efficiency in transmitting/receiving wireless signals. In forming the above-described conductive patterns or the like in the bonding region, the thickness of the conductive patterns or the formation of the pattern groove should be appropriately designed in consideration of the assembly quality and the structural stability of the electronic device.

As described above, an electronic device (e.g., the electronic device 101, 200, or 1200 in FIG. 1, FIG. 2, or FIG. 12) according to various embodiments of the disclosure may include: a housing (e.g., the housing 201 in FIG. 2); an inner plate (e.g., the inner plate 203 in FIG. 2) embedded in the housing and having at least a portion made of a synthetic resin material, wherein the inner plate includes a first surface, a second surface facing away from the first surface, a first through hole (e.g., the first through hole 343*a* in FIG. 5) formed to have a cone-shaped cross section having a diameter that gradually decreases from the first surface toward the second surface, and a second through hole (e.g., the second through hole 343*b* in FIG. 5) disposed adjacent to the first through hole and formed to have a cone-shaped cross section having a diameter that gradually decreases from the second surface toward the first surface; a first conductive line (e.g., the first conductive pattern 204 in FIG. 3) formed on the first surface and formed to at least partially overlap the first through hole when viewed from the first surface; a second conductive line (e.g., the second conductive pattern 441 in FIG. 4) formed on the second surface and formed to at least partially overlap the second through hole when viewed from the second surface; a first conductive layer (e.g., the first conductive layer 545*a* in FIG. 5) deposited conformally on an inner wall of the first through hole and electrically connected to at least one of the first conductive line and the second conductive line; a second conductive layer (e.g., the second conductive layer 545*b* in FIG. 5) deposited conformally on an inner wall of the second through hole and electrically connected to at least one of the first conductive line and the second conductive line; and a wireless communication module (e.g., the wireless communication module 192 in FIG. 1) electrically connected to at least one of the first conductive line and the second conductive line. The first conductive line, the second conductive line, the first conductive layer, and the second conductive layer may include the same composition.

According to various embodiments, the composition of the first conductive pattern, the second conductive pattern, or the conductive layer includes at least one of copper, gold, silver, or a graphene component.

According to various embodiments, the housing may be at least partially made of a metal material, the electronic device may further include an inner structure (e.g., the inner structure S in FIG. 2) integrally formed with the housing, and the inner plate may be mounted on the inner structure.

According to various embodiments, the first conductive line, the second conductive line, the first conductive layer, and the second conductive layer may function as antennas.

According to various embodiments according to the disclosure, an electronic device (e.g., the electronic device 101, 200, or 1200 in FIG. 1, FIG. 2, or FIG. 12) may include: a housing (e.g., the housing 201 in FIG. 2); an inner plate (e.g., the inner plate 203 in FIG. 2) embedded in the housing and having at least a portion made of a synthetic resin material, wherein the inner plate includes a first surface, a second surface facing away from the first surface, and a plurality of through holes (e.g., the through holes 543a and 543b in FIG. 5); a first conductive pattern (e.g., the first conductive pattern 204 in FIG. 3 or FIG. 5) formed on the first surface and overlapping the through holes when viewed from the first surface; a second conductive pattern (e.g., the second conductive pattern 441 in FIG. 5) formed on the second surface and overlapping the through holes when viewed from the second surface; conductive layers formed at least on the inner walls of the through holes (e.g., the conductive layers 545a and 545b in FIG. 5); and a wireless communication module (e.g., the wireless communication module 192 in FIG. 1) electrically connected to the first conductive pattern or the second conductive pattern.

The first conductive pattern, the second conductive pattern, or the conductive layer may include the same composition.

According to various embodiments of the disclosure, an electronic device (e.g., the electronic device 101, 200, or 1200 in FIG. 1, FIG. 2, or FIG. 12) may include: a housing (e.g., the housing 201 in FIG. 2); an inner plate (e.g., the inner plate 203 in FIG. 2) accommodated in the housing and including an electrically conductive material region (e.g., the electrically conductive material region 231 in FIG. 2) and an electrically insulative material region (e.g., the electrically insulative material region 233 in FIG. 2); a circuit board (e.g., the circuit board 1105 in FIG. 11) accommodated in a space surrounded by the housing and the inner plate; and conductive patterns (e.g., the conductive patterns 204 and 441 in FIG. 5) printed on at least one surface of the inner plate in the electrically insulative material region of the inner plate. The circuit board and the conductive patterns may be electrically connected to each other.

According to various embodiments, the electronic device may further include: through holes (e.g., the through holes 343a and 343b in FIG. 5) formed to penetrate opposite surfaces of the inner plate and positioned in a region in which the conductive patterns are formed; and first conductive layers (e.g., the conductive layers 545a and 545b in FIG. 5) formed at least on inner walls of the through holes, respectively.

The conductive patterns may be formed on the opposite surfaces of the inner plate, respectively, and are electrically connected to each other through at least one of the first conductive layers.

According to various embodiments, the conductive patterns may include a first conductive pattern (e.g., the first conductive pattern 204 in FIG. 5) formed on one surface of the inner plate and a second conductive pattern (e.g., the second conductive pattern 441 in FIG. 5) formed on another surface of the inner plate, and the second conductive pattern may be disposed to face a portion of the circuit board.

According to various embodiments, the electronic device may further include a contact terminal mounted on the circuit board and corresponding to the second conductive pattern.

According to various embodiments, the electronic device may further include: an electrically conductive material portion (e.g., the protruding structure 1119 in FIG. 11) protruding inside the housing and mechanically connected to the inner plate; a contact terminal (e.g., the contact terminal 1151 in FIG. 11) mounted on the circuit board and configured to be in electrical contact with the electrically conductive material portion of the housing; and an anti-corrosion layer (e.g., the anti-corrosion layer 1149 in FIG. 11) having at least a portion formed on the electrically conductive material portion of the housing and including a graphene component. A portion of the first conductive pattern may be formed on a surface of the anti-corrosion layer to be electrically connected to the electrically conductive material portion of the housing.

According to various embodiments, the first conductive layers may be formed to at least partially fill the through holes so as to close the through holes.

According to various embodiments, some of the through holes may be formed in a conical shape that gradually decreases in diameter from one surface of the inner plate toward another surface of the inner plate, and some of remaining ones of the through holes may be formed in a conical shape that gradually decreases in diameter from the another surface of the inner plate toward the surface of the inner plate.

According to various embodiments, at least some of the through holes may be formed to have the smallest diameter at an intermediate portion between the opposite surfaces of the inner plate.

According to various embodiments, the electronic device may further include: a fastening hole (e.g., the fastening hole 335 in FIG. 9) formed adjacent to some of the through holes; a second conductive layer (the third conductive layer 943 in FIG. 9) formed on an inner surface of the fastening hole; and a third conductive layer (e.g., the fourth conductive layer 945 in FIG. 9) formed on one surface or another surface of the inner plate so as to electrically connect the second conductive layer to the first conductive layers or the conductive patterns.

According to various embodiments, the conductive patterns or the first conductive layers may be formed by spraying and applying conductive ink.

According to various embodiments, the conductive patterns or the first conductive layers may include at least one of copper, gold, silver, or a graphene component.

According to various embodiments, the electronic device may further include: a communication module (e.g., the wireless communication module 192 in FIG. 1) mounted on the circuit board; and a contact terminal (e.g., the contact terminal 1151 in FIG. 11) mounted on the circuit board and electrically connected to the communication module. When the contact terminal is electrically connected to at least one of the conductive patterns, the communication module may transmit/receive a wireless signal through the conductive patterns or the first conductive layers.

According to various embodiments, the electronic device may further include: an electrically conductive material portion (e.g., the protruding structure 1119 in FIG. 11) protruding inside the housing and mechanically connected to the inner plate; and an anti-corrosion layer (e.g., the anti-corrosion layer 1149 in FIG. 11) having at least a portion formed on the electrically conductive material portion of the housing, the anti-corrosion layer including a graphene component. At least a portion of the first conductive pattern may be formed on the surface of the anti-corrosion layer to be electrically connected to the electrically conductive material portion of the housing, and the contact terminal may be in electrical contact with the electrically conductive material portion of the housing.

According to various embodiments, the electronic device may further include a display device (e.g., the display device 202 or 1202 in FIG. 2 or FIG. 12) bonded to at least a partial region of one surface of the inner plate, and at least some of the conductive patterns may be formed in a bonding region (e.g., the bonding region 1235 in FIG. 12) of the display device.

According to various embodiments, the electronic device may further include: an insulation layer (e.g., the insulation layer 1141 in FIG. 11) formed in the electrically conductive material region of the inner plate. A portion of the conductive pattern may be formed on the insulation layer in the electrically conductive material region of the inner plate.

In the foregoing detailed description, various embodiments of the disclosure have been described. However, it would be evident to a person ordinarily skilled in the art that various modifications may be made without departing from the scope of the disclosure.

The invention claimed is:

1. An electronic device comprising:
a housing;
an inner plate embedded in the housing and having at least a portion made of a synthetic resin material, wherein the inner plate includes a first surface, a second surface facing away from the first surface, a first through hole formed to have a cone-shaped cross section having a diameter that gradually decreases from the first surface toward the second surface, and a second through hole disposed adjacent to the first through hole and formed to have a cone-shaped cross section having a diameter that gradually decreases from the second surface toward the first surface;
a first conductive line formed on the first surface and formed to at least partially overlap the first through hole when viewed from the first surface;
a second conductive line formed on the second surface and formed to at least partially overlap the second through hole when viewed from the second surface;
a first conductive layer deposited conformally on an inner wall of the first through hole and electrically connected to at least one of the first conductive line and the second conductive line;
a second conductive layer deposited conformally on an inner wall of the second through hole and electrically connected to at least one of the first conductive line and the second conductive line; and a wireless communication module electrically connected to at least one of the first conductive line and the second conductive line,
wherein the first conductive line, the second conductive line, the first conductive layer, and the second conductive layer include a same composition.

2. The electronic device of claim 1, wherein the housing is at least partially made of a metal material,
the electronic device further comprises an inner structure integrally formed with the housing, and
the inner plate is mounted on the inner structure.

3. The electronic device of claim 1, wherein the first conductive line, the second conductive line, the first conductive layer, and the second conductive layer function as antennas.

4. An electronic device comprising:
a housing;
an inner plate accommodated in the housing and including an electrically conductive material region and an electrically insulative material region;
a circuit board accommodated in a space surrounded by the housing and the inner plate;
conductive patterns printed on at least one surface of the inner plate in the electrically insulative material region of the inner plate;
through holes formed to penetrate opposite surfaces of the inner plate and positioned in a region in which the conductive patterns are formed; and
first conductive layers formed at least on inner walls of the through holes, respectively,
wherein the conductive patterns are formed on the opposite surfaces of the inner plate, respectively, and are electrically connected to each other through at least one of the first conductive layers,
wherein the circuit board and the conductive patterns are electrically connected to each other,
wherein some of the through holes are formed in a conical shape that gradually decreases in diameter from one surface of the inner plate toward another surface of the inner plate, and
wherein some of remaining ones of the through holes are formed in a conical shape that gradually decreases in diameter from the another surface of the inner plate toward the one surface of the inner plate.

5. The electronic device of claim 4, wherein the conductive patterns include a first conductive pattern formed on one surface of the inner plate and a second conductive pattern formed on another surface of the inner plate, and
the second conductive pattern is disposed to face a portion of the circuit board.

6. The electronic device of claim 5, further comprising:
a contact terminal mounted on the circuit board and corresponding to the second conductive pattern.

7. The electronic device of claim 5, further comprising:
an electrically conductive material portion protruding inside the housing and mechanically connected to the inner plate;
a contact terminal mounted on the circuit board and configured to be in electrical contact with the electrically conductive material portion of the housing; and
an anti-corrosion layer having at least a portion formed on the electrically conductive material portion of the housing, and including a graphene component,
wherein a portion of the first conductive pattern is formed on a surface of the anti-corrosion layer to be electrically connected to the electrically conductive material portion of the housing.

8. The electronic device of claim 4, wherein the first conductive layers are formed to at least partially fill the through holes so as to close the through holes.

9. The electronic device of claim 4, wherein at least some of the through holes are formed to have a smallest diameter at an intermediate portion between the opposite surfaces of the inner plate.

10. The electronic device of claim 4, further comprising:
a fastening hole formed adjacent to some of the through holes;
a second conductive layer formed on an inner surface of the fastening hole; and
a third conductive layer formed on one surface or another surface of the inner plate so as to electrically connect the second conductive layer to the first conductive layers or the conductive patterns.

11. The electronic device of claim 4, further comprising:
a communication module mounted on the circuit board; and
a contact terminal mounted on the circuit board and electrically connected to the communication module,
wherein when the contact terminal is electrically connected to at least one of the conductive patterns, the communication module transmits/receives a wireless signal through the conductive patterns or the first conductive layers.

12. The electronic device of claim 11, further comprising:
an electrically conductive material portion protruding inside the housing and mechanically connected to the inner plate;
an anti-corrosion layer having at least a portion formed on the electrically conductive material portion of the housing, the anti-corrosion layer including a graphene component,
wherein at least a portion of the first conductive pattern is formed on a surface of the anti-corrosion layer to be electrically connected to the electrically conductive material portion of the housing, and the contact terminal is in electrical contact with the electrically conductive material portion of the housing.

13. The electronic device of claim 4, further comprising:
an insulation layer formed in the electrically conductive material region of the inner plate,
wherein a portion of the conductive pattern is formed on the insulation layer in the electrically conductive material region of the inner plate.

* * * * *